United States Patent [19]

Simon et al.

[11] Patent Number: 4,530,895

[45] Date of Patent: Jul. 23, 1985

[54] AQUEOUS-ALKALINE SOLUTION AND PROCESS FOR DEVELOPING POSITIVE-WORKING REPRODUCTION LAYERS

[75] Inventors: Ulrich Simon, Mainz-Lerchenberg; Rainer Beutel, Wiesbaden-Breckenheim, both of Fed. Rep. of Germany

[73] Assignee: Hoechst Aktiengesellschaft, Frankfurt am Main, Fed. Rep. of Germany

[21] Appl. No.: 599,189

[22] PCT Filed: Aug. 3, 1983

[86] PCT No.: PCT/EP83/00205

§ 371 Date: Apr. 11, 1984

§ 102(e) Date: Apr. 11, 1984

[87] PCT Pub. No.: WO84/00826

PCT Pub. Date: Mar. 1, 1984

[30] Foreign Application Priority Data

Aug. 13, 1982 [DE] Fed. Rep. of Germany ....... 3230171

[51] Int. Cl.³ .......................... G03C 5/18; G03C 1/52; G03C 5/00; G03F 7/00
[52] U.S. Cl. .................................... 430/145; 430/193; 430/309; 430/326; 430/331
[58] Field of Search ............... 430/331, 326, 302, 309, 430/159, 193, 145

[56] References Cited

U.S. PATENT DOCUMENTS

| | | | |
|---|---|---|---|
| 3,110,596 | 11/1963 | Heiss et al. | 430/302 |
| 4,141,733 | 2/1979 | Guild | 430/326 |
| 4,411,981 | 10/1983 | Minezaki | 430/331 |
| 4,423,138 | 12/1983 | Guild | 430/331 |
| 4,464,461 | 8/1984 | Guild | 430/331 |

FOREIGN PATENT DOCUMENTS

| | | |
|---|---|---|
| 23758 | 2/1981 | European Pat. Off. . |
| 62733 | 10/1982 | European Pat. Off. ................. 331/ |
| 2834958 | 2/1980 | Fed. Rep. of Germany . |
| 143920 | 9/1980 | Fed. Rep. of Germany ...... 430/331 |
| 0056092 | 10/1981 | Fed. Rep. of Germany . |
| 158280 | 12/1975 | Japan . |
| 4423 | 2/1978 | Japan . |
| 1367830 | 9/1974 | United Kingdom . |
| 1591988 | 7/1981 | United Kingdom . |

OTHER PUBLICATIONS

EP-A2 0 55 814—European Patent Application filed 10-27-81.

IBM Technical Disclosure Bulletin, vol. 13, No. 7, p. 2009.

IBM Technical Disclosure Bulletin, vol. 16, No. 2, p. 426.

*Primary Examiner*—Mary F. Downey
*Attorney, Agent, or Firm*—Schwartz, Jeffery, Schwaab, Mack, Blumenthal & Evans

[57] ABSTRACT

The aqueous-alkaline developer solution for radiation-sensitive, positive-working reproduction layers contains silicate and a quaternary ammonium base, such as tetraalkylammonium hydroxide; it may further contain a salt of an organic, optionally substituted, aromatic monocarboxylic acid, for example, a benzoate. This solution is in particular used for developing reproduction layers which contain an o-naphthoquinone diazide as the radiation-sensitive compound and an alkali-soluble resin and which are applied to a support material based on aluminum, which comprises at least one aluminum oxide layer produced by anodic oxidation.

14 Claims, No Drawings

AQUEOUS-ALKALINE SOLUTION AND PROCESS FOR DEVELOPING POSITIVE-WORKING REPRODUCTION LAYERS

BACKGROUND OF THE INVENTION

The present invention relates to an aqueous-alkaline developer solution for radiation-sensitive, positive-working reproduction layers based on silicates and at least one further component, and to a process for developing said layers.

Radiation-sensitive reproduction layers are used, for example, in the preparation of offset printing forms or of photoresists (below, both these are called copying materials), that is to say they are in general applied by the user or the manufacturer to a support. The supports used for these copying materials are metals, such as zinc, magnesium, chromium, copper, brass, steel, silicon, aluminum or combinations of these metals, plastic films, paper or similar materials. These supports can be coated with the radiation-sensitive reproduction layer without any modifying pretreatment, but preferably they are coated after carrying out a surface modification, such as mechanical, chemical and/or electrochemical roughening, an oxidation and/or treatment with agents rendering the surface hydrophilic (for example, in the case of supports for offset printing plates). In addition to at least one radiation-sensitive compound, the conventional reproduction layers contain in most cases also an organic binder (resins or the like) and, optionally, also plasticizers, pigments, dyes, wetting agents, sensitizers, adhesion-promoters, indicators and other customary auxiliaries. After they have been exposed, the reproduction layers are developed in order to produce an image from them. For example, a printing form or a photoresist is obtained in this way.

A developer for positive-working reproduction layers must be capable of dissolving those parts of the layer which have been struck by electromagnetic radiation (the later non-image areas) away from the exposed layer without substantially affecting those parts of the layer which have not been struck by the radiation (the later image areas).

In German Patent No. 12 00 133 (equivalent to U.S. Pat. No. 3,110,596), which can be mentioned as a representative example, the following are listed as examples of suitable developers: alkaline-aqueous solutions of phosphates, silicates, fluorosilicates, stannates, fluoroborates or fluorotitanates, which may additionally contain water-soluble hydrocolloids or organic solvents.

Various alternatives or modifications have been proposed by the prior art in order to improve these aqueous-alkaline developer solutions.

German Offenlegungsschrift No. 28 34 958 (=ZA-PS No. 79/4131) describes a process for developing positive-working light-sensitive layers based on o-naphthoquinone diazides and alkali-soluble resins, in which the exposed areas of the layer are washed out with a developer solution containing (a) a substance having an alkaline reaction, such as water glass, sodium metasilicate, $Na_3PO_4$, $K_3PO_4$, $Na_2HPO_4$, $K_2HPO_4$, NaOH, KOH, diethylamine, ethanolamine, or triethanolamine, and (b) a salt, oxide or hydroxide of an element of the groups IIa, IIIa or IIIb of the Periodic Table, such as calcium, strontium, or barium.

British Pat. No. 1,591,988 discloses a developing method for positive-working, light-sensitive layers which are based on o-naphthoquinone diazide esters and alkali-soluble resins, by means of a developer containing (a) 75 to 99.5 percent by volume of an aqueous-alkaline solution, for example, of Na-metasilicate or $Na_3PO_4$, and (b) 0.5 to 25 percent by volume of an organic solvent, such as alkanols or alkane diols (or the monoethers thereof). Further components mentioned in the specification are NaOH, Na-benzoate, dimethylformamide, polyethylene glycol, $Na_2HPO_4$ and tetrasodium ethylenediamine tetraacetate.

In IBM Technical Disclosure Bulletin, Vol. 13, No. 7, 12/1970, page 2,009 M. J. Grieco et al. state that aqueous-alkaline or alcoholic-alkaline solutions which do not contain $Na^+$ ions, which have a pH range of from 9 to 13 and contain between 5 and 25 percent of tetramethylammonium hydroxide can be used for developing positive-working photoresists.

In the production of semi-conductor layers in accordance with Japanese unexamined patent application No. 158 280/75 (published Dec. 22, 1975), positive-working photoresists based on o-naphthoquinone diazides and novolak resins are developed with an aqueous solution containing between 1 and 4 percent by weight of tetramethylammonium hydroxide.

In Japanese examined patent application No. 4423/78 (published Feb. 17, 1978), aqueous or alcoholic solutions of tetraalkylammonium hydroxide (alkyl $C_1$ to $C_7$) are described as suitable developers for positive-working photoresists based on o-naphthoquinone diazides and novolak resins. Tetrahydroxyethylammonium hydroxide is also mentioned as a developer component, but said to be less suitable.

From German Offelegungsschrift No. 23 12 499 (equivalent to British Pat. No. 1,367,830), positive-working photoresists based on diazoquinone siloxanes and alkali-soluble binders are known, which are developed by means of an aqueous solution containing 1.7 percent by weight of tetramethylammonium hydroxide and an anionic surfactant.

The developer for positive-working, quinone diazide-containing, light-sensitive layers used for photoresists and printing plates, according to U.S. Pat. No. 4,141,733, contains 1 to 30 percent by weight of methyl-trihydroxy-ethylammonium hydroxide in an aqueous solution. In comparative examples, tetramethylammonium hydroxide, tetraethylammonium hydroxide, benzyl-methyldihydroxy-ethylammonium hydroxide and benzylhydroxy-ethyldimethylammonium hydroxide are likewise used.

In accordance with the teaching of European Offenlegungsschrift No. 0 023 758 (equivalent to U.S. Pat. No. 4,294,211) quarternary ammonium hydroxides possessing at least one hydroxyalkyl group can be stabilized in developers by adding sulfites, hydrosulfites or pyrosulfites (disulfites, metasulfites).

However, all these known developers still have various disadvantages, for example, they often attack the aluminum oxide layer on the support materials of the printing plates, or they result in a gradation which is too flat (not sufficiently steep) in the image areas.

SUMMARY OF THE INVENTION

It has therefore been the object of the present invention to propose a developer for positive-working, radiation-sensitive reproduction layers, the use of said developer resulting in a printing form which shows no substantial attack to the support material of the layer and possesses a relatively steep gradation and good resolution capacity in the image areas.

DETAILED DESCRIPTION OF PREFERRED EMBODIMENTS

The invention is based on the known, aqueous-alkaline developer solution for radiation-sensitive, positive-working reproduction layers comprising silicates and at least one further component. The developer solution of the invention is characterized in that it contains a quaternary ammonium base. The term "quaternary ammonium base" is meant to include not only those compounds which already before being added to the aqueous-alkaline developer solution are present in the form of bases, but also compounds yielding quaternary ammonium ions which in the aqueous-alkaline are present in the ionic equilibrium, such as for example, quaternary ammonium salts which in the developer solution dissociate. In particular, the quaternary ammonium base is a tetraalkylammonium hydroxide having identical or different alkyl substituents with 1 to 6 carbon atoms.

These include, for example:
tetramethylammonium hydroxide (TMAH)
tetraethylammonium hydroxide (TEAH)
tetrapropylammonium hydroxide (TPAH)
tetrabutylammonium hydroxide (TBAH)
tributylmethylammonium hydroxide (TBMAH)

Apart from water as the solvent, the aqueous-alkaline developer solution mainly comprises a silicate, and especially an alkali metal silicate, such as sodium metasilicate, preferably in an amount of from 5 to 15 percent by weight, and in particular of from 6 to 13 percent by weight. In the case of relatively low silicate concentrations, scumming may be observed after development, depending on the quantity of the remaining components contained in the solution. This effect can be prevented by varying the type or concentration of the remaining components.

Advantageously, the amount of quaternary ammonium base contained in this aqueous-alkaline solution ranges between 0.001 and 1.0 percent by weight, and in particular between 0.002 and 0.1 percent by weight. Preferred developer solutions additionaly contain a salt of an organic, optionally substituted, aromatic monocarboxylic acid, in particular an alkali metal salt of optionally substituted benzoic acid, such as sodium benzoate or sodium salicylate, in an amount of 0.01 to 10.0 percent by weight, and especially of 0.1 to 5.0 percent by weight.

In addition to the components mentioned above, the developer solution according to this invention may also contain conventional additives, such as ionogenic or nonionogenic surfactants, anti-foam agents, agents for modifying the viscosity, preserving agents, complex formers or—in an amount of not more than 5 percent by weight—water-miscible organic solvents.

In accomplishing the object of the present invention, there has further been provided a process for developing exposed, radiation-sensitive, positive-working reproduction layers present on a support material based on aluminum, which comprises washing-out the exposed layer areas by means of the developer solution of the invention.

The reproduction layer to be developed is present in particular as a part (radiation-sensitive layer) of an offset printing plate or as a resist applied to a support material (photoresist layer). The preferred support materials are aluminum or one of its alloys. These supports can be provided with a suitable reproduction layer without a special modifying pretreatment, but preferably coating is carried out only after a surface modification, such as mechanical, chemical and/or electrochemical roughening, an oxidation and/or treatment with hydrophilizing agents (especially in the case of supports for offset printing plates).

The aluminum support materials for printing plates encountered very frequently in practice, which have an aluminum content of more than 98.5 percent by weight and contain small amounts of Si, Fe, Ti, Cu and Zn are in general roughened mechanically (for example, by brushing and/or by treatment with abrasive agents), chemically (for example, by etching) or electrochemically (for example, by treatment with alternating current in aqueous solutions of HCL or $HNO_3$), before the radiation-sensitive layer is applied. The mean peak-to-valley height $R_z$ of the roughened surface is in this case in the range from about 1 to 15 μm. The peak-to-valley height is determined in accordance with DIN 4768, October 1970 version, and the peak-to-valley height $R_z$ is then the arithmetic mean of the individual peak-to-valley heights of five mutually adjacent individual measuring lengths.

The preferred electrochemical roughening process is then followed, if appropriate, by an anodic oxidation of the aluminum in a further process stage which can be used, for example, in order to improve the wear and the adhesion properties of the surface of the support material. For the anodic oxidation, the customary electrolytes, such as $H_2SO_4$, $H_3PO_4$, $H_2C_2O_4$, amidosulfonic acid, sulfosuccinic acid, sulfosalicylic acid or mixtures thereof can be used. For example, reference is made to the following standard methods for the use of aqueous electrolytes containing $H_2SO_4$ for the anodic oxidation of aluminum (in this context see, for example, M. Schenk, Werkstoff Aluminium und seine anodische Oxydation (Aluminum as a Material and Its Anodic Oxidation), Francke Verlag—Bern, 1948, page 760; Praktische Galvanotechnik (Electroplating in Practice), Eugen G. Leuze Verlag—Saulgau, 1970, pages 395 et seq. and pages 518/519; W. Huebner and C. I. Speiser, Die Praxis der anodischen Oxidation des Aluminiums (Anodic Oxidation of Aluminum In Practice), Aluminium Verlag—Düsseldorf, 1977, 3rd edition, pages 137 et seq.):

The direct current sulfuric acid process in which the anodic oxidation is carried out in an aqueous electrolyte composed usually of about 230 g of $H_2SO_4$ per liter of solution at 10° C. to 22° C. and at a current density of 0.5 to 2.5 A/dm² for a period of 10 to 60 minutes. The sulfuric acid concentration in the aqueous electrolyte solution can in this case also be reduced to 8 to 10% by weight of $H_2SO_4$ (about 100 g of $H_2SO_4$/l) or increased to 30% by weight (365 g of $H_2SO_4$/l) and higher.

"Hard anodizing" is carried out with an aqueous electrolyte containing $H_2SO_4$ in a concentration of 166 g of $H_2SO_4$/l (or about 230 g of $H_2SO_4$/l) at an operating temperature of 0° C. to 5° C., at a current density of 2 to 3 A/dm², and a voltage rising from about 25 to 30 V at the start to about 40 to 100 V toward the end of the treatment, for a period of 30 to 200 minutes.

In addition to the processes for the anodic oxidation of printing plate support materials already mentioned in the preceding paragraph, the following processes, for example, can also be used: the anodic oxidation of aluminum in an aqueous electrolyte which contains $H_2SO_4$ and has an $Al^{3+}$ ion content adjusted to values of more than 12 g/l (according to German Offenlegungsschrift No. 2,811,396=U.S. Pat. No. 4,211,619), in an aqueous electrolyte containing $H_2SO_4$ and $H_3PO_4$ (according to German Offenlegungsschrift No. 2,707,810=U.S. Pat. No. 4,049,504) or in an aqueous electrolyte containing $H_2SO_4$, $H_3PO_4$ and $Al^{3+}$ ions (according to German Offenlegungsschrift No. 2,836,803=U.S. Pat. No. 4,229,226). Direct current is preferably used for anodic oxidation, but alternating current or a combination of these types of current (for example, direct current with superposed alternating current) can also be used. The layer weigts of aluminum oxide are within a range from about 1 to 10 $g/m^2$, corresponding to a layer thickness of about 0.3 to 3.0 $\mu m$.

The anodic oxidation stage of the aluminum printing plate support material can also be followed by one or more post-treatment stages. Post-treatment is here understood especially as a chemical or electrochemical treatment which renders the aluminum oxide layer hydrophilic, for example, treatment of the material by dipping in an aqueous polyvinylphosphonic acid solution according to German Pat. No. 1,621,478 (=British Pat. No. 1,230,447), treatment by dipping in an aqueous alkali metal silicate solution according to German Auslegeschrift No. 1,471,707 (=U.S. Pat. No. 3,181,461) or an electrochemical treatment (anodizing) in an aqueous alkali metal silicate solution according to German Offenlegungsschrift No. 2,532,769 (=U.S. Pat. No. 3,902,976). The purpose of these post-treatment stages is, in particular, to additionally increase the hydrophilic character of the aluminum oxide layer (although this is already adequate for many applications) while at least preserving the other properties of this layer.

Although the aqueous-alkaline developer solution of the present invention can be used for all positive-working reproduction layers, it is particularly well suited for layers which contain o-quinone diazides, and especially o-naphthoquinone diazides, such as low-molecular weight or high-molecular weight esters or amides of naphthoquinone-(1,2)-diazide(2)-sulfonic acid, as the radiation-sensitive compound. Apart from at least one of these o-quinone diazides, these reproduction layers contain alkali-soluble resins, for example, phenolic resins, copolymers of acrylic or methacrylic acid, copolymers of maleic acid, and other polymers containing groups which are capable of forming salts, phenolic resins, and in particular novolaks, being preferred. Further possible layer components are, inter alia, small amounts of other alkali-soluble resins, dyes, plasticizers, adhesion-promoters or surfactants. Reproduction layers of this type are, for example, described in German Patents No. 854,890, No. 865,109, No. 879,203, No. 894,959, No. 938,233, No. 1,109,521, No. 1,144,705, No. 1,118,606, No. 1,120,273, No. 1,124,817 and No. No. 2,331,377, and in European Offenlegungsschriften No. 0,021,428 and No. 0,055,814.

Using this invention, a relatively steep gradation and a good resolution capacity of the image areas after development are achieved. Thereby, a good differentiation between the image areas and the non-image areas is observed, i.e., the layer components to be dissolved away can be removed without any remainders being left and without penetration of developer underneath the image areas occuring. Despite the excellent developing capacity, the support materials of the reproduction layers, and in particular the aluminum oxide layers, are not attacked by the developer solution of the present invention, when customary developing times are used.

It is also possible to employ higher silicate concentrations than usual in known developer solutions, without an equally strong attack to the oxide layer being observed.

In the examples which follow percentages mean percent by weight. Parts by weight have the same relationship to parts by volume as the g to the $cm^3$.

EXAMPLES 1 TO 100 AND COMPARATIVE EXAMPLES C1 TO C16

An aluminum plate which has been electrochemically roughened in an acid and anodically oxidized (oxide layer weight about 3 $g/m^2$) is subjected to a hydrophilizing post-treatment by dipping into an aqueous solution of polyvinylphosphonic acid and dried. The support material pretreated in this way is then provided with a positive-working, radiation-sensitive coating of (see European Offenlegungsschrift No. 0,055,814):

1.82 parts by weight of a naphthoquinone diazide sulfonic acid ester having a diazo nitrogen content of 4.7%, prepared from naphthoquinone-(1,2)-diazide-(2)-5-sulfonic acid chloride, a cresol/formaldehyde novolak and 2,3,4-trihydroxybenzophenone, in the presence of a base, 0.22 part by weight of naphthoquinone-(1,2)-diazide-(2)-4-sulfonic acid chloride, 0.07 part by weight of a cresol/formaldehyde novolak having a melting range of 105° to 120° C. (acc. to DIN 53,181), and 0.08 part by weight of crystal violet, in 91.19 parts by weight of a mixture comprising 5 parts by volume of tetrahydrofuran, 4 parts by volume of ethyleneglycolmonomethyl ether, and 1 part by volume of butyl acetate.

The weight of the layer after drying is 2.3 $g/m^2$. The copying material thus prepared is imagewise exposed through a screened positive original for 1 minute and subsequently developed, using one of the developer solutions listed in the table below. Development is performed for 2 or 10 minutes, respectively, whereby in no case any substantial attack to the oxide layer is stated after 2 minutes. The comparison of developer solutions composed in accordance with this invention with developer solutions not containing either the silicate or the quaternary ammonium base component clearly shows the progress achieved by the invention, namely, a steeper gradation in the image areas and a positive influence on the oxide layer attack (i.e., the attack to the oxide layer is reduced). When the benzoate admixture is reduced or omitted in the developer solutions according to the invention, the values concerning gradation and resolution capacity do not change significantly. It is found, however, that the benzoate admixture helps to reduce the attack to the oxide layer to a certain degree. In Comparative Examples C6 to C15, both TEAH and TBMAH were used as quaternary ammonium base.

The measure of the steepness of gradation is the difference between the first solid step and the last clean step of a 13-step exposure test wedge having a wedge constant of 0.15 (density of the first step=0.15, density of the last step=1.95; for example, Kalle Belichtungstestkeil (Exposure Test Wedge) BK 01, sold by Kalle Niederlassung der Hoechst AG). The smaller this difference is, the steeper is the gradation.

The resolution capacity is determined by means of the so-called "K-field" of the FOGRA Precision Measuring Strip "PMS-K" (see "fogra praxis report", No. 24, "Die FOGRA-Präzisionsmessstreifen" (The FOGRA Precision Measuring Strips), published by Deutsche Forschungsgesellschaft für Druck- und Reproduktionstechniken, e. V. (FOGRA), January 1979, Munich). The "K-field" is composed of 9 partial fields comprising gaps and lines of 9 different widths ranging from 4 to 40 μm. Each partial field is identified by a number indicating the respective line and gap widths in μm. The "K-value" (see Table), which varies between 4 and 40 thus denotes the finest line field which can be reproduced. If, for example, the "K-value" is 4, i.e., the resolution capacity is 4 μm, lines and gaps having a width of down to 4 μm can be reproduced separately on a copy.

Throughout the Examples, the silicate used is $Na_2SiO_3.9H_2O$, and the benzoate used is a Na-benzoate.

TABLE

| Example No. | Content in % by weight of aqueous-alkaline developer solution of | | | Developing speed | | | |
|---|---|---|---|---|---|---|---|
| | Silicate | Benzoate | quaternary ammonium base | after 2 min Steepness of gradation | after 10 min Steepness of gradation | Resolution capacity | oxid layer attack |
| C1 | 5.3(α) | — | — | 7.0 | 8.0 | 4 | no |
| C2 | 6.0 | 1.0 | — | 7.0 | 7.5 | 6 | no |
| C3 | 8.0 | 1.0 | — | 6.5 | 8.5 | 8 | no |
| C4 | 10.0 | 1.0 | — | 10.0 | (γ) | 12 | strong |
| C5 | 12.0 | 1.0 | — | 10.0 | (γ) | 12 | strong |
| C6 | — | — | 0.01 | —(δ) | — | — | — |
| C7 | — | — | 0.10 | — | — | — | — |
| C8 | — | — | 1.00 | — | — | — | — |
| C9 | — | — | 5.00 | — | — | — | — |
| C10 | — | — | 10.00 | — | — | — | — |
| C11 | — | 1.0 | 0.01 | — | — | — | — |
| C12 | — | 1.0 | 0.10 | — | — | — | — |
| C13 | — | 1.0 | 1.00 | — | — | — | — |
| C14 | — | 1.0 | 5.00 | — | — | — | — |
| C15 | — | 1.0 | 10.00 | — | — | — | — |
| C16 | 7.2(β) | — | — | 7.0 | 6.0 | 6 | no |
| 1 | 6.0 | 1.0 | TMAH 0.01 | 4.0 | 6.0 | 4 | no |
| 2 | 6.0 | 1.0 | " 0.02 | 5.0 | 6.0 | 4 | " |
| 3 | 6.0 | 1.0 | " 0.04 | (+) | 6.0 | 4 | " |
| 4 | 6.0 | 1.0 | " 0.08 | (+) | (+) | 4 | " |
| 5 | 6.0 | 1.0 | " 0.10 | (+) | (+) | 4 | " |
| 6 | 6.0 | 1.0 | TEAH 0.01 | 3.0 | 5.0 | 4 | no |
| 7 | 6.0 | 1.0 | " 0.02 | (+) | 4.0 | 4 | " |
| 8 | 6.0 | 1.0 | " 0.04 | (+) | (+) | 4 | " |
| 9 | 6.0 | 1.0 | " 0.08 | (+) | (+) | (+) | " |
| 10 | 6.0 | 1.0 | " 0.10 | (+) | (+) | (+) | |
| 11 | 6.0 | 1.0 | TPAH 0.01 | 3.5 | 4.0 | 4 | no |
| 12 | 6.0 | 1.0 | " 0.02 | 3.0 | 3.0 | 4 | " |
| 13 | 6.0 | 1.0 | " 0.04 | 3.0 | 5.0 | 4 | " |
| 14 | 6.0 | 1.0 | " 0.08 | (+) | (+) | 4 | " |
| 15 | 6.0 | 1.0 | " 0.10 | (+) | (+) | 4 | " |
| 16 | 6.0 | 1.0 | TBAH 0.01 | 4.0 | 5.5 | 4 | no |
| 17 | 6.0 | 1.0 | " 0.02 | 3.0 | 4.0 | 4 | " |
| 18 | 6.0 | 1.0 | " 0.04 | 3.0 | 3.5 | 4 | " |
| 19 | 6.0 | 1.0 | " 0.08 | 3.0 | 5.0 | 4 | " |
| 20 | 6.0 | 1.0 | " 0.10 | (+) | 4 | " | |
| 21 | 6.0 | 1.0 | TBMAH 0.01 | 3.0 | 4.0 | 4 | no |
| 22 | 6.0 | 1.0 | " 0.02 | 4.0 | 4.0 | 4 | " |
| 23 | 6.0 | 1.0 | " 0.04 | (+) | (+) | 4 | " |
| 24 | 6.0 | 1.0 | " 0.08 | (+) | (+) | 4 | " |
| 25 | 6.0 | 1.0 | " 0.10 | (+) | (+) | 4 | |
| 26 | 8.0 | 1.0 | TMAH 0.01 | 5.0 | 5.0 | 6 | no |
| 27 | 8.0 | 1.0 | " 0.02 | 5.0 | 5.0 | 6 | " |
| 28 | 8.0 | 1.0 | " 0.04 | 4.5 | 5.0 | 4 | " |
| 29 | 8.0 | 1.0 | " 0.08 | 5.0 | 4.5 | 4 | " |
| 30 | 8.0 | 1.0 | " 0.10 | 4.5 | 5.0 | 4 | " |
| 31 | 8.0 | 1.0 | TEAH 0.01 | (+) | 5.0 | 4 | no |
| 32 | 8.0 | 1.0 | " 0.02 | 2.0 | (+) | 4 | " |
| 33 | 8.0 | 1.0 | " 0.04 | 2.0 | 2.5 | 4 | " |
| 34 | 8.0 | 1.0 | " 0.08 | 1.5 | 2.5 | 6 | " |
| 35 | 8.0 | 1.0 | " 0.10 | 3.0 | 5.0 | 6 | " |
| 36 | 8.0 | 1.0 | TPAH 0.01 | 3.5 | 4.0 | 6 | no |
| 37 | 8.0 | 1.0 | " 0.02 | 2.0 | 6.0 | 6 | " |
| 38 | 8.0 | 1.0 | " 0.04 | 3.0 | 3.0 | 6 | " |
| 39 | 8.0 | 1.0 | " 0.08 | 3.0 | 5.0 | 4 | " |
| 40 | 8.0 | 1.0 | " 0.10 | 3.5 | 6.5 | 4 | " |
| 41 | 8.0 | 1.0 | TBAH 0.01 | 4.5 | 3.5 | 8 | no |
| 42 | 8.0 | 1.0 | " 0.02 | 4.0 | 3.0 | 8 | " |

TABLE-continued

| | | | | | | | | |
|---|---|---|---|---|---|---|---|---|
| 43 | 8.0 | 1.0 | " | 0.04 | 3.0 | 2.5 | 6 | " |
| 44 | 8.0 | 1.0 | " | 0.08 | 3.5 | 4.5 | 6 | " |
| 45 | 8.0 | 1.0 | " | 0.10 | 3.0 | 4.5 | 6 | " |
| 46 | 8.0 | 1.0 | TEMAH | 0.01 | 3.0 | 3.0 | 6 | no |
| 47 | 8.0 | 1.0 | " | 0.02 | 2.5 | 3.0 | 6 | " |
| 48 | 8.0 | 1.0 | " | 0.04 | 3.0 | 5.0 | 4 | " |
| 49 | 8.0 | 1.0 | " | 0.08 | 3.5 | 5.0 | 4 | " |
| 50 | 8.0 | 1.0 | " | 0.10 | 4.0 | 5.5 | 4 | " |
| 51 | 10.0 | 1.0 | TMAH | 0.01 | 5.0 | 6.0 | 6 | slight |
| 52 | 10.0 | 1.0 | " | 0.02 | 5.5 | 7.0 | 4 | " |
| 53 | 10.0 | 1.0 | " | 0.04 | 5.0 | 5.0 | 4 | " |
| 34 | 10.0 | 1.0 | " | 0.08 | 5.0 | 5.0 | 4 | " |
| 55 | 10.0 | 1.0 | " | 0.10 | 4.0 | 4.5 | 4 | " |
| 56 | 10.0 | 1.0 | TEAH | 0.01 | 3.0 | 4.0 | 6 | slight |
| 57 | 10.0 | 1.0 | " | 0.02 | 2.0 | 2.5 | 6 | " |
| 58 | 10.0 | 1.0 | " | 0.04 | 2.5 | 2.5 | 6 | " |
| 59 | 10.0 | 1.0 | " | 0.08 | 2.0 | 3.5 | 4 | " |
| 60 | 10.0 | 1.0 | " | 0.10 | 4.5 | 5.0 | 4 | " |
| 61 | 10.0 | 1.0 | TPAH | 0.01 | 3.5 | 4.0 | 8 | slight |
| 62 | 10.0 | 1.0 | " | 0.02 | 3.5 | 5.0 | 8 | " |
| 63 | 10.0 | 1.0 | " | 0.04 | 2.5 | 3.5 | 6 . | " |
| 64 | 10.0 | 1.0 | " | 0.08 | 3.0 | 3.5 | 6 | " |
| 65 | 10.0 | 1.0 | " | 0.10 | 3.0 | 4.5 | 4 | " |
| 66 | 10.0 | 1.0 | TBAH | 0.01 | 4.0 | 5.5 | 10 | slight |
| 67 | 10.0 | 1.0 | " | 0.02 | 3.5 | 4.0 | 8 | " |
| 68 | 10.0 | 1.0 | " | 0.04 | 4.0 | 4.5 | 6 | " |
| 69 | 10.0 | 1.0 | " | 0.08 | 4.0 | 5.0 | 6 | " |
| 70 | 10.0 | 1.0 | " | 0.10 | 4.0 | 5.0 | 6 | " |
| 71 | 10.0 | 1.0 | TBMAH | 0.01 | 2.5 | 3.0 | 6 | slight |
| 72 | 10.0 | 1.0 | " | 0.02 | 3.0 | 3.0 | 6 | " |
| 73 | 10.0 | 1.0 | " | 0.04 | 3.0 | 4.0 | 6 | " |
| 74 | 10.0 | 1.0 | " | 0.08 | 2.5 | 4.0 | 6 | " |
| 75 | 10.0 | 1.0 | " | 0.10 | 3.0 | 5.0 | 4 | " |
| 76 | 12.0 | 1.0 | TMAH | 0.01 | 8.0 | 11.0 | 6 | strong |
| 77 | 12.0 | 1.0 | " | 0.02 | 9.0 | 10.0 | 6 | " |
| 78 | 12.0 | 1.0 | " | 0.04 | 7.0 | 8.5 | 6 | " |
| 79 | 12.0 | 1.0 | " | 0.08 | 6.0 | 7.5 | 6 | " |
| 80 | 12.0 | 1.0 | " | 0.10 | 6.0 | 6.0 | 4 | " |
| 81 | 12.0 | 1.0 | TEAH | 0.01 | 4.0 | 6.0 | 6 | strong |
| 82 | 12.0 | 1.0 | " | 0.02 | 3.5 | 6.0 | 8 | " |
| 83 | 12.0 | 1.0 | " | 0.04 | 1.5 | 2.0 | 6 | " |
| 84 | 12.0 | 1.0 | " | 0.08 | 1.0 | 2.5 | 4 | " |
| 85 | 12.0 | 1.0 | " | 0.10 | 3.0 | 6.0 | 6 | " |
| 86 | 12.0 | 1.0 | TPAH | 0.01 | 3.5 | 5.0 | 10 | strong |
| 87 | 12.0 | 1.0 | " | 0.02 | 2.5 | 7.0 | 6 | " |
| 88 | 12.0 | 1.0 | " | 0.04 | 2.0 | 3.0 | 8 | slight |
| 89 | 12.0 | 1.0 | " | 0.08 | 2.0 | 4.0 | 6 | strong |
| 90 | 12.0 | 1.0 | " | 0.10 | 2.5 | 5.0 | 6 | " |
| 91 | 12.0 | 1.0 | TBAH | 0.01 | 5.0 | 7.0 | 10 | slight |
| 92 | 12.0 | 1.0 | " | 0.02 | 4.0 | 6.0 | 10 | " |
| 93 | 12.0 | 1.0 | " | 0.04 | 3.0 | 4.0 | 8 | strong |
| 94 | 12.0 | 1.0 | " | 0.08 | 3.0 | 5.0 | 8 | " |
| 95 | 12.0 | 1.0 | " | 0.10 | 4.0 | 6.0 | 6 | " |
| 96 | 12.0 | 1.0 | TBMAH | 0.01 | 4.0 | 6.0 | 8 | strong |
| 97 | 12.0 | 1.0 | " | 0.02 | 3.0 | 4.0 | 8 | " |
| 98 | 12.0 | 1.0 | " | 0.04 | 3.0 | 4.0 | 8 | " |
| 99 | 12.0 | 1.0 | " | 0.08 | 3.0 | 6.0 | 8 | " |
| 100 | 12.0 | 1.0 | " | 0.10 | 3.0 | 5.5 | 6 | " |

[α]further components are 3.4% by weight of $Na_3PO_4.12 H_2O$ and 0.3% by weight of $NaH_2PO_4$
[β]further components are 0.02% by weight of $Sr^{3+}$ ions and 0.03% by weight of levulinic acid
[γ]with the preset exposure time, no solid wedge step can be determined
[δ]no development (i.e., differentiation into image areas and non-image areas) takes place
[+]scumming is observed in the non-image areas
[−]percentages always relate to a 20% aqueous solution, i.e., 0.01% actually means 0.002% of active substance

What is claimed is:

1. An aqueous-alkaline developer solution for radiation-sensitive, positive-working production layers, comprising (a) from 0.001 to 1.0 percent by weight of a tetraalkyl ammonium hydroxide comprising alkyl substituents which are identical or different and which comprise from 1 to 6 carbon atoms, or of a salt of said tetraalkylammonium hydroxide, and (b) from 5 to 15 percent by weight of an alkali metal silicate.

2. A developer solution as claimed in claim 1, further comprising a salt of an aromatic monocarboxylic acid.

3. A developer solution as claimed in claim 2, wherein said salt of said acid is a benzoate.

4. A developer solution as claimed in claim 2, wherein said salt of said acid is present in an amount ranging from 0.01 to 10.0 percent by weight.

5. A process for developing an exposed, radiation-sensitive, positive-working reproduction layer on a support material comprised of aluminum or an aluminum alloy, comprising the step of washing out exposed areas of said layer with an aqueous-alkaline developer solution comprising (a) from 0.001 to 1.0 percent by weight of a tetraalkyl ammonium hydroxide comprising alkyl substituents which are identical or different and which comprise from 1 to 6 carbon atoms, or of a salt of said tetraalkylammonium hydroxide, and (b) from 5 to 15 percent by weight of an alkali metal silicate.

6. A process as claimed in claim 5, wherein said developer solution further comprises a salt of an aromatic monocarboxylic acid.

7. A process as claimed in claim 6, wherein said reproduction layer comprises an o-naphthoquinone diazide as radiation-sensitive compound and an alkali-soluble resin.

8. A process as claimed in claim 7, wherein said support material comprises at least one aluminum oxide layer produced by anodic oxidation.

9. A process as claimed in claim 6, wherein said support material comprises at least one aluminum oxide layer produced by anodic oxidation.

10. A process as claimed in claim 6, wherein said salt of said acid is a benzoate.

11. A process as claimed in claim 6, wherein said salt of said acid is present in an amount ranging from 0.01 to 10.0 percent by weight.

12. A process as claimed in claim 5, wherein said reproduction layer comprises an o-naphthouinone diazide compound and an alkali-soluble resin.

13. A process as claimed in claim 12, wherein said support material comprises at least one aluminum oxide layer produced by anodic oxidation.

14. A process as claimed in claim 5, wherein said support material comprises at least one aluminum oxide layer produced by anodic oxidation.

* * * * *